United States Patent
Wang He et al.

(10) Patent No.: US 9,316,852 B2
(45) Date of Patent: Apr. 19, 2016

(54) LENS WITH DIFFUSION STRUCTURE AND BACKLIGHT MODULE INCORPORATING THE SAME

(71) Applicant: HON HAI PRECISION INDUSTRY CO., LTD., New Taipei (TW)

(72) Inventors: Li-Ying Wang He, New Taipei (TW); Yi Hung, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 41 days.

(21) Appl. No.: 14/085,658

(22) Filed: Nov. 20, 2013

(65) Prior Publication Data

US 2015/0049463 A1    Feb. 19, 2015

(30) Foreign Application Priority Data

Aug. 15, 2013 (TW) .............................. 102129377 A

(51) Int. Cl.
| | | |
|---|---|---|
| *F21V 5/00* | (2015.01) | |
| *F21V 5/04* | (2006.01) | |
| *G02F 1/133* | (2006.01) | |
| *G02B 3/00* | (2006.01) | |
| *G02F 1/1335* | (2006.01) | |
| *G02B 5/02* | (2006.01) | |
| *H01L 21/00* | (2006.01) | |
| *H01L 33/58* | (2010.01) | |

(52) U.S. Cl.
CPC *G02F 1/133* (2013.01); *G02B 3/00* (2013.01); *G02F 1/133606* (2013.01); *G02B 5/0215* (2013.01); *G02B 5/0278* (2013.01); *G02F 2001/133607* (2013.01); *H01L 21/00* (2013.01); *H01L 33/58* (2013.01)

(58) Field of Classification Search
CPC .................... G02F 2001/133607; G02F 1/133; G02F 1/133606; F21V 5/045; F21V 5/04; F21V 5/008; F21V 5/007; F21K 9/50; G02B 19/0014; G02B 3/00; G02B 5/0215; G02B 5/0278; H01L 21/00; H01L 33/58
USPC .......... 362/97.1–97.3, 335–339, 309, 311.02, 362/522, 244, 311.06–311.1, 330, 310, 601, 362/617, 608; 257/98; 359/642
See application file for complete search history.

(56) References Cited

U.S. PATENT DOCUMENTS

| | | | | |
|---|---|---|---|---|
| 5,404,869 | A * | 4/1995 | Parkyn, Jr. ......... | G02B 19/0028 126/698 |
| 7,182,481 | B2 * | 2/2007 | Shimura ...................... | 362/244 |
| 7,344,902 | B2 * | 3/2008 | Basin ...................... | H01L 24/97 257/E33.059 |

(Continued)

*Primary Examiner* — Elmito Breval
*Assistant Examiner* — Arman B Fallahkhair
(74) *Attorney, Agent, or Firm* — Novak Druce Connolly Bove + Quigg LLP

(57) ABSTRACT

A lens for an LED backlight module includes a main lens body and a diffusion structure consisting of a plurality of micro lenses. The main lens body includes a light incident face for receiving light from an LED light source and a light exit face opposite to the light incident face thereof. Light leaves the lens from the light exit face. The micro lenses of the diffusion structure are formed on the light exit face of the main lens body. Each micro lens is annular and has a generally triangular cross section. Each micro lens includes a first light scattering surface and a second light scattering surface intersecting with the first light scattering surface. The micro lenses are arranged in a series of concentric circles with regard to a center of the lens. A backlight module source incorporating the lens and the LED light source is also provided.

17 Claims, 7 Drawing Sheets

(56) References Cited

U.S. PATENT DOCUMENTS

| | | | |
|---|---|---|---|
| 7,355,560 B2 * | 4/2008 | Nagai | 343/911 R |
| 7,582,913 B2 * | 9/2009 | Huang et al. | 257/98 |
| 7,679,095 B2 * | 3/2010 | Kondo | 257/98 |
| 7,956,375 B2 * | 6/2011 | Li et al. | 257/98 |
| 8,105,853 B2 * | 1/2012 | Xu | 438/27 |
| 8,162,512 B2 * | 4/2012 | Chen | B32B 37/12 362/308 |
| 8,956,010 B2 * | 2/2015 | Huang | 362/246 |
| 2014/0328069 A1 * | 11/2014 | Jeong | G02B 3/00 362/335 |

* cited by examiner

LENS WITH DIFFUSION STRUCTURE AND BACKLIGHT MODULE INCORPORATING THE SAME

TECHNICAL FIELD

The present disclosure relates generally to a lens and a backlight module incorporating the lens, wherein the lens has a diffusion structure which enables light from a light source to have a uniform light intensity distribution.

DESCRIPTION OF RELATED ART

LEDs are solid state light emitting devices formed of semiconductors, which are more stable and reliable than other conventional light sources such as incandescent bulbs. Thus, LEDs are being widely used in various fields such as numeral/character displaying elements, signal lights, light sources for lighting and display devices.

Nowadays, LED light sources are widely applied for illumination, such as being used in direct-type backlight module assembly. The direct-type backlight module assembly includes an LED light source and a lens coupled to the LED light source to spread light emitted from the LED light source into a wide angular range. However, a light intensity distribution of the backlight module assembly is mostly concentrated at a center while becomes gradually weaker towards a periphery thereof. Therefore, such a lens and a backlight module using the lens are difficult to satisfy the requirements of uniform light intensity distribution.

What is needed therefore is a lens and a backlight module incorporating the lens which can overcome the above mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
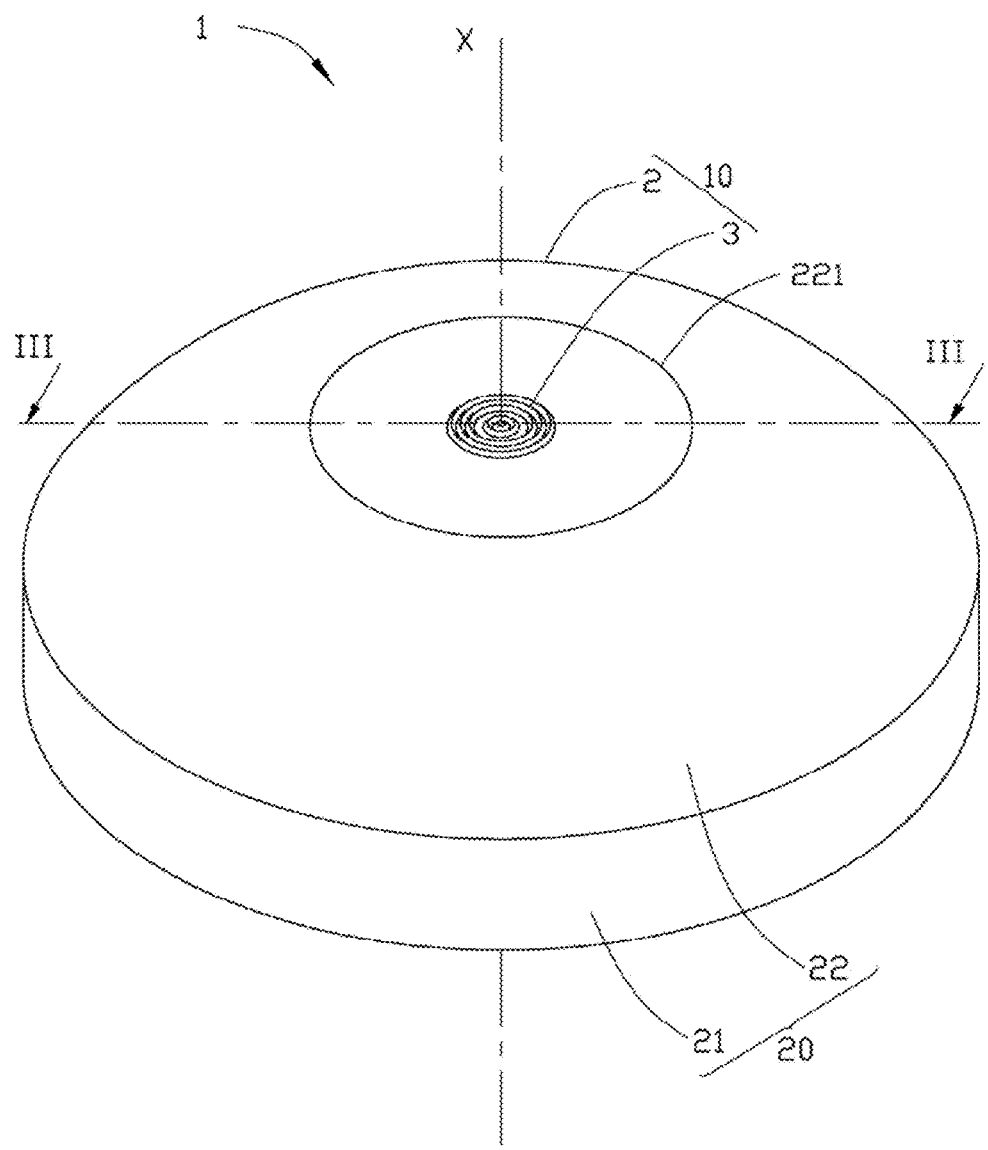
FIG. 1 is an isometric, perspective view of a backlight module in accordance with a first embodiment of the present disclosure.
Figure 2:
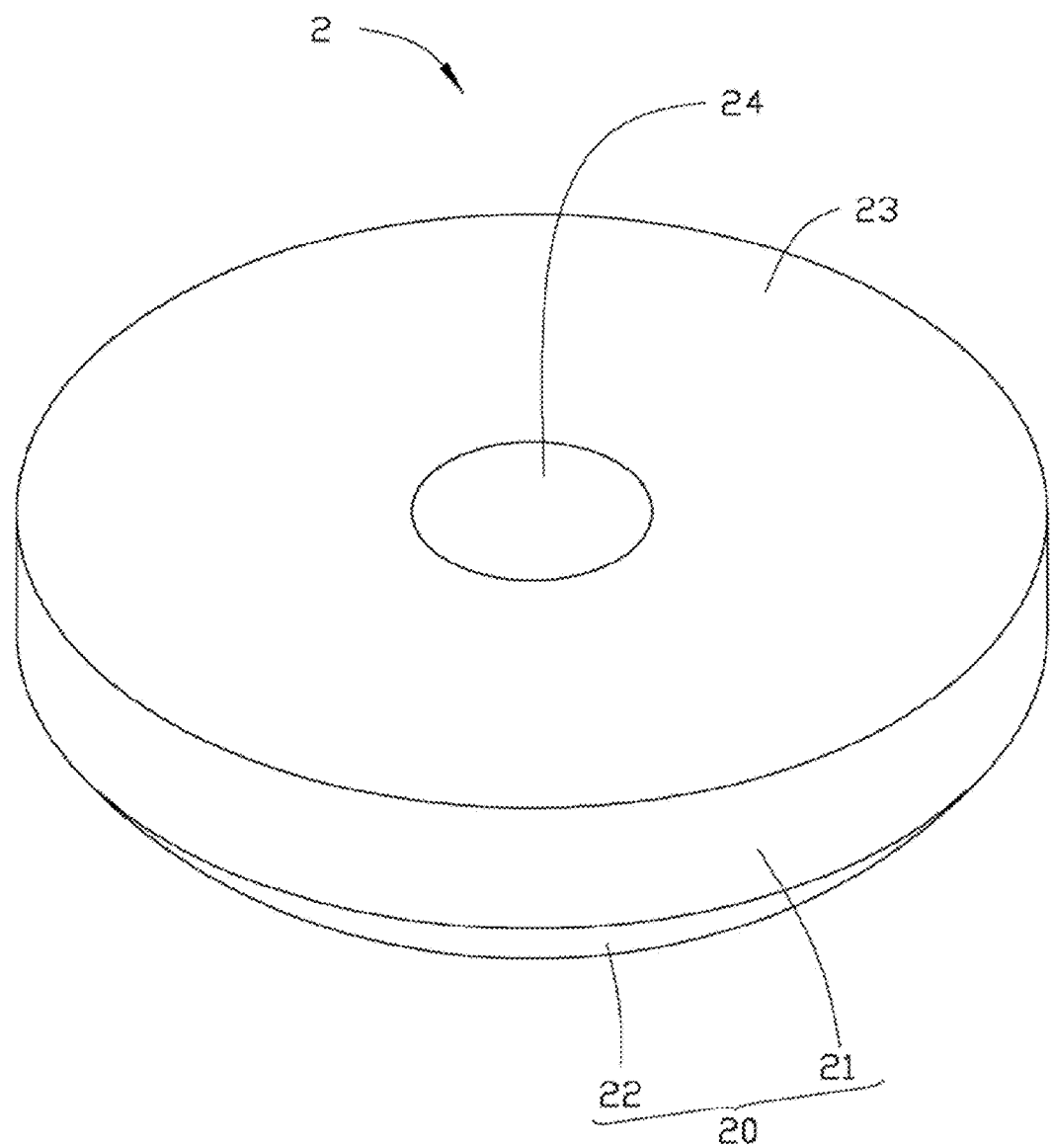
FIG. 2 is an inverted view of a lens of the backlight module of FIG. 1.
Figure 3:
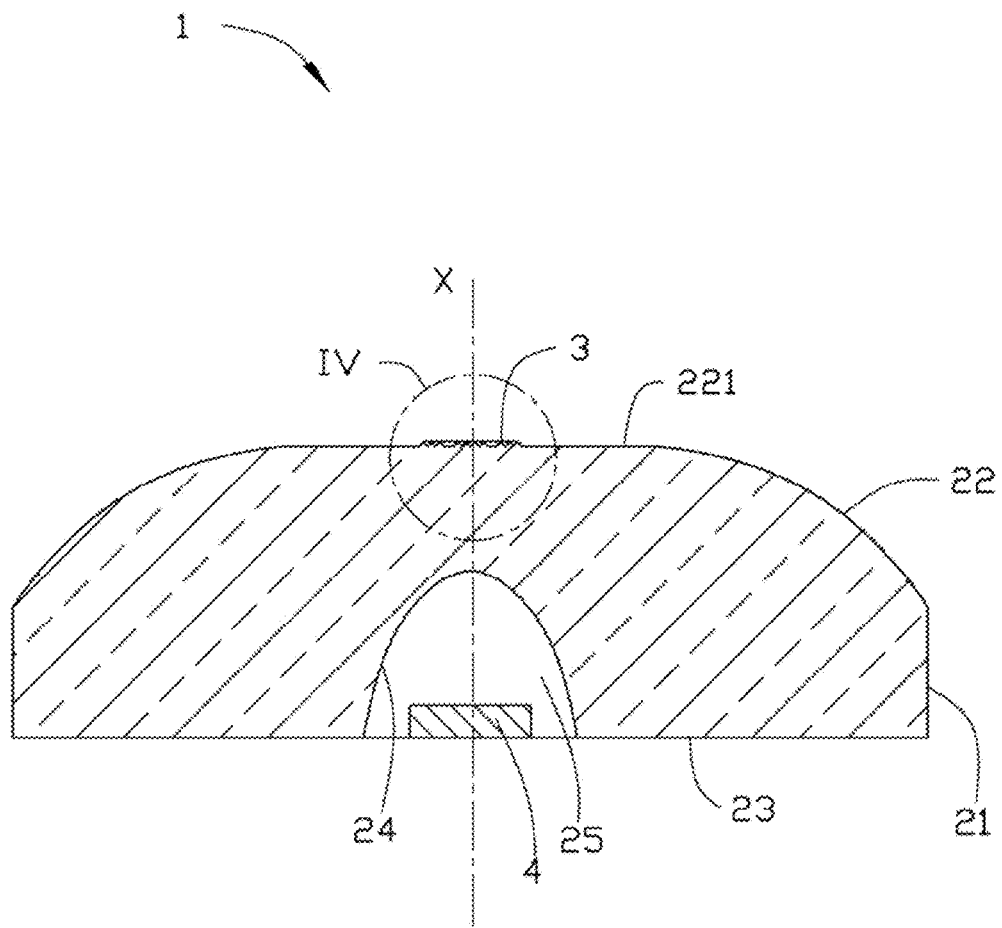
FIG. 3 is a cross-sectional view of the backlight module of FIG. 1, taken along a line III-III thereof.
Figure 4:
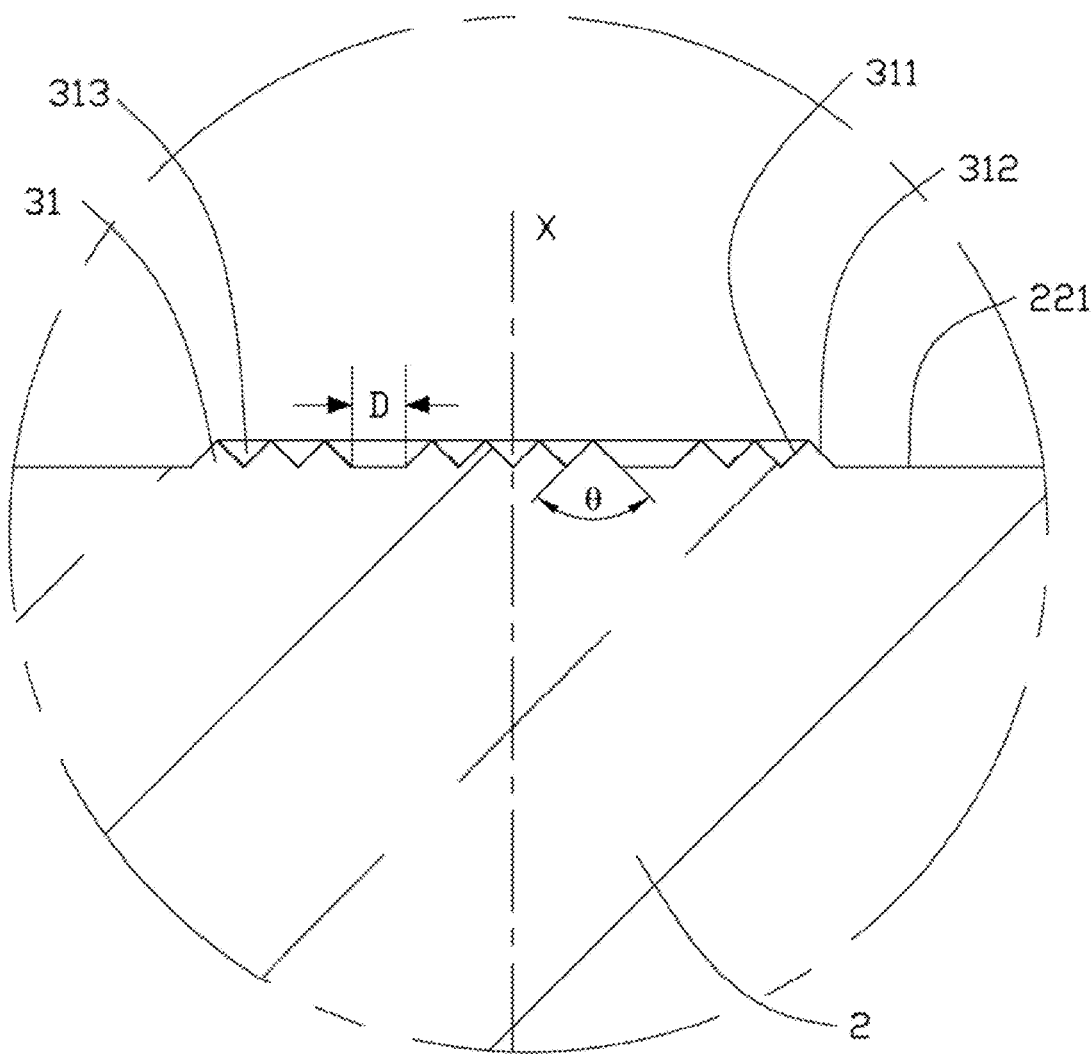
FIG. 4 is an enlarged view of part IV of FIG. 3.

Referring to FIGS. 1, 2 and 3, a backlight module 1 in accordance with a first embodiment of the present disclosure includes an LED light source 4 and a lens 10 optically coupled to the LED light source 4. The lens 10 includes a main lens body 2 and a diffusion structure 3 positioned on a center of a top side of the main lens body 2. The diffusion structure 3 includes a plurality of micro lenses 31 (FIG. 4).

The main lens body 2 includes a light incident face 24 and a light exit face 20 opposite to the light incident face 24. The micro lenses 31 of the diffusion structure 3 are formed on the light exit face 20 of the main lens body 2, and each of the micro lenses 31 of the diffusion structure 3 is annular in shape. The micro lenses 31 of the light diffusion structure 3 are arranged in a series of concentric circles with regard to a center point located on an optical axis X of the main lens body 2 of the lens 10.

The main lens body 2 includes an annular mounting face 23 interconnecting the light incident face 24 and the light exit face 20 thereof. The light incident face 24 is located at a center of the mounting face 23 and recessed inwardly from an inner periphery of the mounting face 23 toward a light exit face 20 of the main lens body 2.

The light exit face 20 includes a primary light exit face 22 and a second light exit face 21. The second light exit face 21 extends upwardly from an outer periphery of the mounting face 23. The primary light exit face 22 bends inwardly and upwardly from a top edge of the second light exit face 21. A central portion 221 of the primary light exit face 22 is a horizontal plane. The micro lenses 31 of the diffusion structure 3 are positioned on the central portion 221 of the primary light exit face 22 of the main lens body 2.

The mounting face 23 is flat for firmly securing the backlight module 1 to a substrate such as a printed circuit board (not shown) by gluing. The mounting face 23 and the light incident face 24 of the main lens body 2 cooperatively define a receiving space 25. The LED light source 4 is received in the receiving space 25 and faces the light incident face 24 of the main lens body 2, and an optical axis of the LED light source 4 coincides with the optical axis X of the main lens body 2 of the lens 10.

Light emitted from the LED light source 4 is refracted into the main lens body 2 through the light incident face 24 thereof, and most of the light concentrated near the optical axis X passes through the main lens body 2 and is scattered by the micro lenses 31 of the diffusion structure 3 positioned on the top side of the main lens body 2 in all directions, with the remaining light directly emerging from the primary and second light exit faces 22, 21 of the main lens body 2.

In the present embodiment, the light incident face 24 is a concave face and the light exit face 20 is a convex face. The main lens body 2 is radially symmetrical relative to the optical axis X thereof. In detail, the light incident face 24 is a part of paraboloid of revolution. Alternatively, the light incident face 24 is a part of an ellipsoid with a major axis thereof coinciding with the optical axis X of the main lens body 2 of the lens 10, and the central portion 221 of the primary light exit face 22 is located over the light incident face 24.

Referring to FIG. 4, each micro lens 31 of the diffusion structure 3 includes a first light scattering surface 311 and a second scattering surface 312 intersecting with the first scattering surface 311. The first and second scattering surfaces 311, 312 of each micro lens 31 of the diffusion structure 3 are inclined relative to the optical axis X of the main lens body 2 of the lens 10.

Each micro lens 31 of the diffusion structure 3 has a generally triangular cross section. The first and second light scattering surfaces 311, 312 of each micro lens 31 of the diffusion structure 3 are both slightly arc-shaped. In more details, the first scattering surface 311 is a slightly concave surface and recessed inwardly toward the second scattering surface 312, and the second scattering surface 312 is a slightly convex surface and projects outwardly away from the first scattering surface 311. In the present embodiment, each micro lens 31 of the diffusion structure 3 has a uniform height along the optical axis X of the main lens body 2 of the lens 10.

In the present embodiment, the diffusion structure 3 has five micro lenses 31 arranged on the primary light exit face 22 of the main lens body 2. The five micro lenses 31 are divided into a central group consisting of two micro lenses 31 and an outer group consisting of three micro lenses 31. The central group and the outer group are spaced from each other at a predetermined distance D along the radial direction of the lens 10, thereby exposing an annular region of the primary light exit face 22 therebetween. Adjacent micro lenses 31 in the same group are connected with each other side by side. That is, a second light scattering surface 312 of one micro lens 31 is immediately connected with a first light scattering surface 311 of an adjacent micro lens 31 in the same group.

Every two adjacent micro lenses 31 of the same group define an annular groove 313 therebetween, and a width of the groove 313 decreases gradually along the optical axis X of the main lens body 2 of the lens 10 from the top to the base of each micro lens 31 of the diffusion structure 3. An angle θ defined between the first and second light scattering surfaces 311, 312 of each micro lens 31 is equal to each other.

Figure 5:
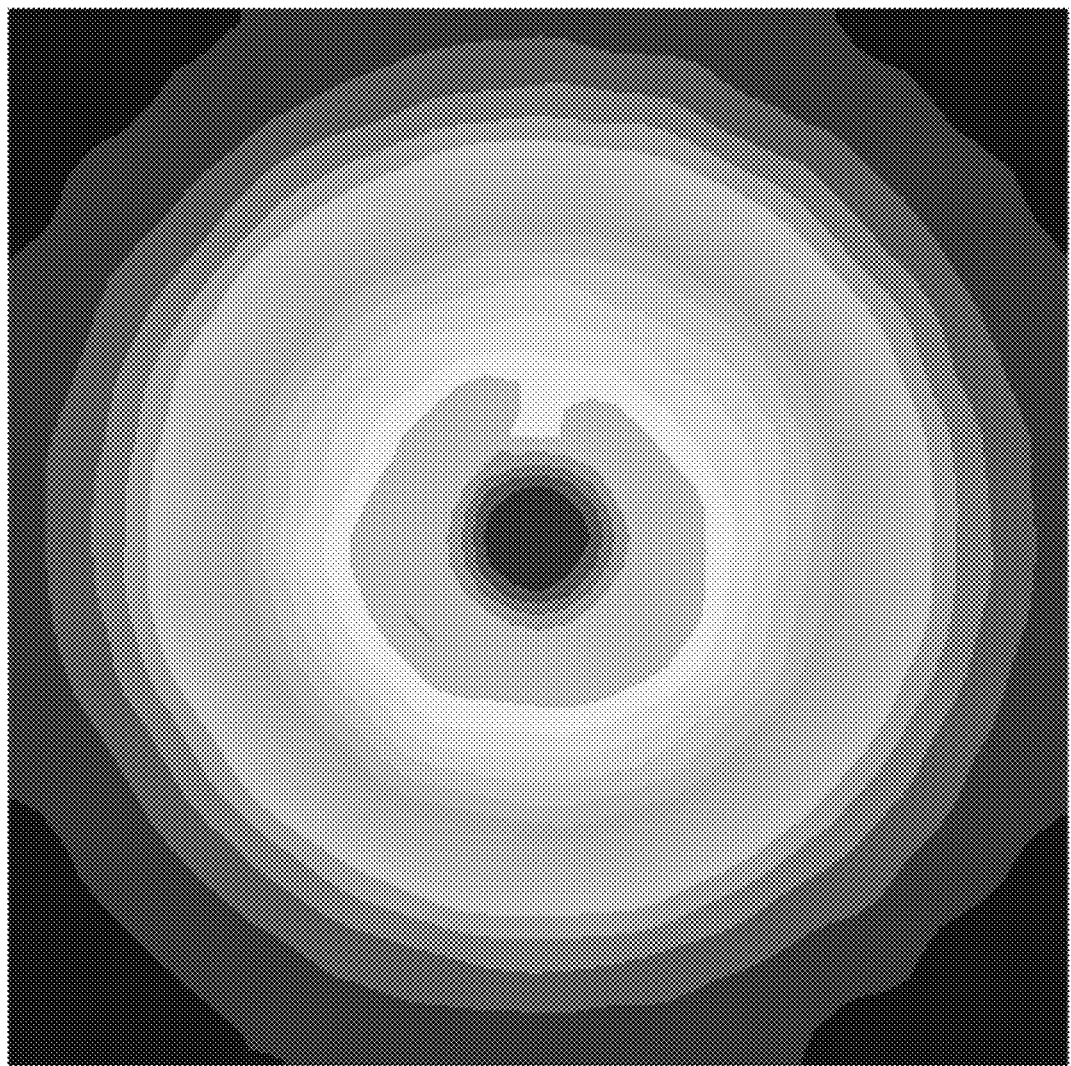
FIG. 5 is a light intensity distribution of a backlight module which uses a lens similar to that shown in FIG. 1, however without a diffusion structure formed on a center of a top thereof.

Referring to FIG. 5, a light intensity distribution of a backlight module having a lens similar to the lens 10 of FIG. 1 is illustrated, except that there is no diffusion structure 3 consisting of a plurality of micro lenses 31 formed on a top of the lens. The LED light source 4 is optically coupled to the lens in a manner as that shown in FIG. 3. Light emitted from the LED light source 4 is refracted into lens through the light incident face, and most of the light concentrated near the optical axis of the LED light source 4 is directly refracted out the lens into the ambient air from the light exit face, thereby to generate a hot spot at a center of the light distribution having the highest light intensity.

Figure 6:
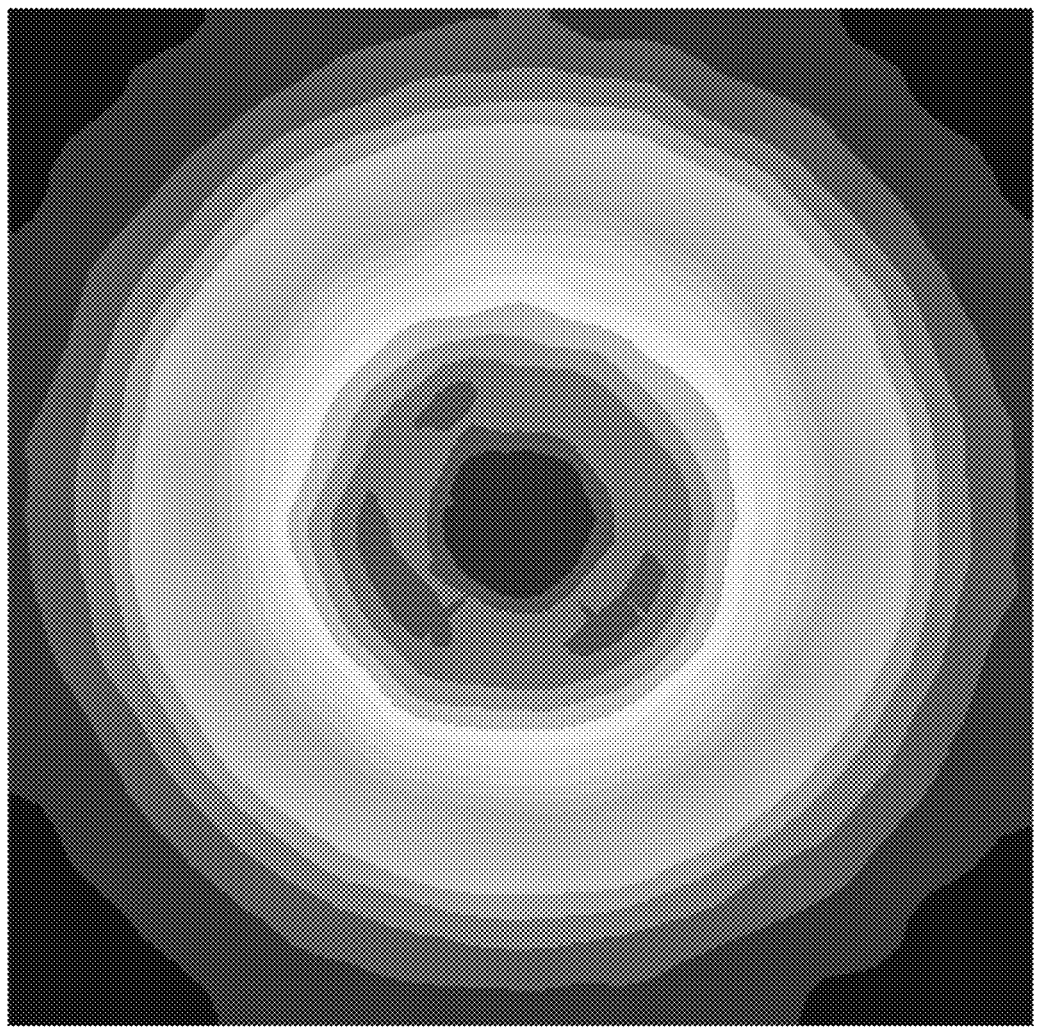
FIG. 6 is a light intensity distribution of the backlight module of FIG. 1.

Referring to FIG. 6, a light intensity distribution of the backlight module 1 in accordance with the first embodiment of the present disclosure is shown. In the present embodiment, light emitted from the LED light source 4 is refracted into the main lens body 2 through the light incident face 24 thereof, and most of the light concentrated near the optical axis X passes through the main lens body 2 and is scattered by the micro lenses 31 of the diffusion structure 3 positioned on the top side of the main lens body 2 in all directions, thereby eliminating the hot spot existing in the light distribution. Thus, the backlight module 1 having a uniform light intensity distribution is obtained.

Figure 7:
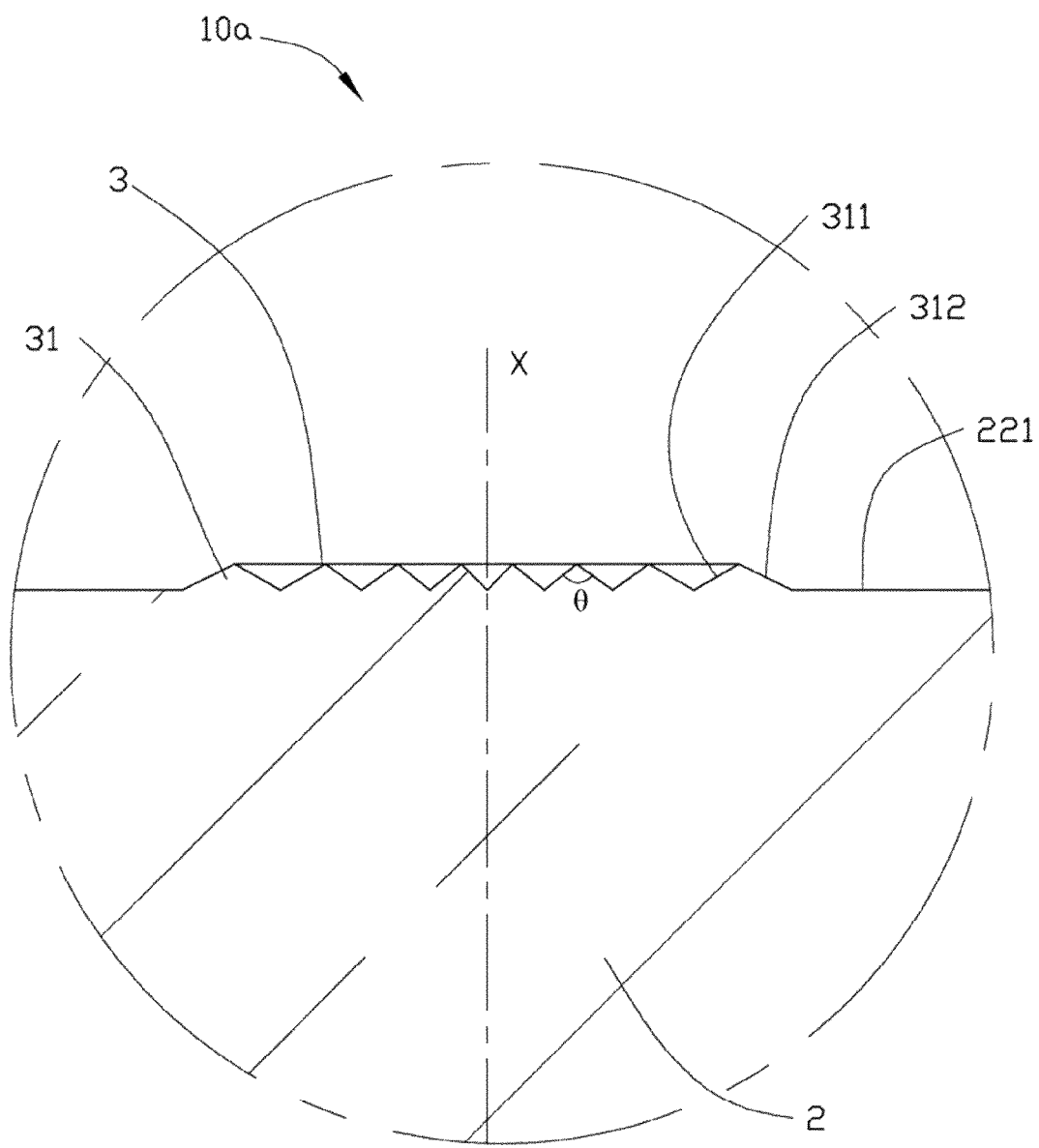
FIG. 7 is similar to FIG. 4, but shows a lens of a backlight module in accordance with a second embodiment of the present disclosure.

Referring to FIG. 7, a lens 10a of a backlight module in accordance with a second embodiment of the present disclosure includes a main lens body 2 and a diffusion structure 3 having plurality of micro lenses 31 positioned on a central region 221 of the light exit face 22 of the main lens body 2. Different from the lens 10 of the backlight module 1 shown in the FIG. 4, the micro lenses 31 of the diffusion structure 3 of the lens 10a are connected with each other side by side. An angle θ defined between the first and second light scattering surfaces 311, 312 of each micro lens 31 increases gradually along a radial direction perpendicular to the optical axis X of the main lens body 2 from a center toward an outer periphery of the light exit face 22 of the main lens body 2.

It is understood that the micro lenses 31 of the diffusion structure 3 and the main lens body 2 are integrally formed together as a single piece in the present disclosure. Alternatively, the micro lenses 31 of the diffusion structure 3 and the main lens body 2 could be separately molded or formed, and then combined into one integrated piece by gluing.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments.

What is claimed is:

1. A lens for an LED (light emitting diode) backlight module comprising:
    a main lens body comprising a light incident face configured for receiving light from an LED light source and a light exit face opposite to the light incident face thereof; and
    a diffusion structure having a plurality of micro lenses formed on the light exit face of the main lens body;
    wherein each micro lens is annular, and the micro lenses are arranged in a series of concentric circles with regard to a center point located on an optical axis of the main lens body of the lens;
    wherein each micro lens comprises a first light scattering surface and a second light scattering surface intersecting with the first scattering surface, and the first light scattering surface and the second light scattering surface are both inclined relative to the optical axis of the main lens body of the lens; and
    wherein an angle defined between the first and second light scattering surfaces of each micro lens increases gradually along a radial direction perpendicular to the optical axis of the main lens body from a center toward an outer periphery of the light exit face of the main lens body, the first light scattering surface intersected with the optical axis of the main lens body of the lens forms a concave surface.

2. The lens of claim 1, wherein the main lens body further comprises an annular mounting face interconnecting the light incident face and the light exit face, and the light incident face is located at a center of the mounting face and recessed inwardly from an inner periphery of the mounting face toward the light exit face.

3. The lens of claim 2, wherein the light exit face of the main lens body comprises a primary light exit face and a second light exit face, and the second light exit face extends upwardly from an outer periphery of the mounting face, the primary light exit face bending inwardly and upwardly from a top edge of the second light exit face.

4. The lens of claim 3, wherein a central portion of the primary light exit face of the main lens body is a horizontal plane, and the micro lenses are positioned on the central portion of the primary light exit face.

5. The lens of claim 1, wherein the transverse cross section of each micro lens is generally triangular.

6. The lens of claim 5, wherein at least a second light scattering surface of a micro lens is connected with a first light scattering surface of an adjacent micro lens.

7. The lens of claim 6, wherein the micro lenses are connected with each other side by side.

8. The lens of claim 5, wherein at least two adjacent micro lenses are spaced from each other at a predetermined distance to expose an annular region of the light exit face therebetween in the radial direction of the lens.

9. A backlight module comprising:
    an LED light source; and
    a lens optically coupled to the LED light source, comprising a main lens body comprising a light incident face from which light generated by the LED light source enters the lens and a light exit face opposite to the light incident face thereof, and a diffusion structure having a plurality of micro lenses formed on the light exit face of the main lens body, the light generated by the LED light sources leaving the lens from the light exit face;

wherein each micro lens is annular, and the micro lenses are arranged in a series of concentric circles with regard to a center point located on an optical axis of the main lens body of the lens;

wherein each micro lens comprises a first light scattering surface and a second light scattering surface intersecting with the first scattering surface, the first and second light scattering surfaces are inclined relative to the optical axis of the main lens body of the lens, and the LED light source faces the light incident face of the main lens body of the lens; and wherein an angle defined between the first and second light scattering surfaces of each micro lens increases gradually along a radial direction perpendicular to the optical axis of the main lens body from a center toward an outer periphery of the light exit face of the main lens body, the first light scattering surface intersected with the optical axis of the main lens body of the lens forms a concave surface.

10. The backlight module of claim 9, wherein the main lens body further comprises an annular mounting face interconnecting the light incident face and the light exit face, and the light incident face is located at a center of the mounting face and recessed inwardly from an inner periphery of the mounting face toward the light exit face.

11. The backlight module of claim 10, wherein the light exit face of the main lens body comprises a primary light exit face and a second light exit face, the second light exit face extends upwardly from an outer periphery of the mounting face, and the primary light exit face bends inwardly and upwardly from a top edge of the second light exit face.

12. The backlight module of claim 11, wherein a central portion of the primary light exit face of the main lens body is a horizontal plane, and the micro lenses are positioned on the central portion of the primary light exit face.

13. The backlight module of claim 10, wherein the mounting face and the light incident face cooperatively define a receiving space, and the LED light source is received in the receiving space with an optical axis of thereof coinciding with the optical axis of the main lens body.

14. The backlight module of claim 9, wherein the transverse cross section of each micro lens is generally triangular.

15. The backlight module of claim 14, wherein at least a second light scattering surface of a micro lens is connected with a first light scattering surface of an adjacent micro lens.

16. The backlight module of claim 15, wherein the micro lenses are connected with each other side by side.

17. The backlight module of claim 14, wherein at least two adjacent micro lenses are spaced from each other at a predetermined distance to expose an annular region of the light exit face therebetween in the radial direction of the lens.

* * * * *